(12) United States Patent
Gao et al.

(10) Patent No.: US 11,985,850 B2
(45) Date of Patent: May 14, 2024

(54) DISPLAY MODULE AND DISPLAY APPARATUS

(71) Applicant: BOE Technology Group Co., Ltd., Beijing (CN)

(72) Inventors: Meiling Gao, Beijing (CN); Yonghong Zhou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 165 days.

(21) Appl. No.: 17/628,522

(22) PCT Filed: Mar. 24, 2021

(86) PCT No.: PCT/CN2021/082600
§ 371 (c)(1),
(2) Date: Jan. 19, 2022

(87) PCT Pub. No.: WO2021/227668
PCT Pub. Date: Nov. 18, 2021

(65) Prior Publication Data
US 2022/0255035 A1    Aug. 11, 2022

(30) Foreign Application Priority Data
May 12, 2020    (CN) .......................... 202010395454.9

(51) Int. Cl.
*H10K 50/87*    (2023.01)
*H10K 59/40*    (2023.01)
*H10K 102/00*    (2023.01)

(52) U.S. Cl.
CPC ............. *H10K 50/87* (2023.02); *H10K 59/40* (2023.02); *H10K 2102/311* (2023.02)

(58) Field of Classification Search
CPC .. H10K 50/87; H10K 59/40; H10K 2102/311; G09F 9/301; G06F 3/0412; H05K 7/20954
See application file for complete search history.

(56) References Cited

U.S. PATENT DOCUMENTS

| | | | |
|---|---|---|---|
| 9,781,826 B2 | 10/2017 | Jeong et al. | |
| 10,517,196 B2 | 3/2019 | Chen et al. | |
| 2019/0197282 A1* | 6/2019 | Gong | .................. G02B 5/3025 |
| 2021/0143224 A1* | 5/2021 | Chen | ..................... H10K 50/87 |
| 2022/0110226 A1 | 4/2022 | Zhang et al. | |

FOREIGN PATENT DOCUMENTS

| | | |
|---|---|---|
| CN | 107507518 A | 12/2017 |
| CN | 109817835 A | 5/2019 |
| CN | 110854292 A | 2/2020 |
| CN | 210535212 U | 5/2020 |
| CN | 111429807 A | 7/2020 |

* cited by examiner

*Primary Examiner* — Kyoung Lee
(74) *Attorney, Agent, or Firm* — IPro, PLLC

(57) ABSTRACT

A display module and a display apparatus, the display apparatus implementing grounding of a support planarization layer (300) by means of at least one of a grounded first heat dissipation layer (400) and second heat dissipation layer (500) being electrically connected to the support planarization layer (300), so that the grounded support planarization layer (300) does not interfere with touch control signals in the display module, improving the touch control performance of the display module.

18 Claims, 5 Drawing Sheets

DISPLAY MODULE AND DISPLAY APPARATUS

CROSS-REFERENCE TO RELATED APPLICATIONS

The present disclosure is a National Stage of International Application No. PCT/CN2021/082600, filed Mar. 24, 2021, which claims priority to the Chinese Patent Application No. 202010395454.9, filed to China National Intellectual Property Administration on May 12, 2020, and entitled "DISPLAY MODULE AND DISPLAY APPARATUS", the entire content of which is incorporated herein by reference.

FIELD

The present disclosure relates to the technical field of display, in particular to a display module and a display apparatus.

BACKGROUND

At present, an electronic device with a folding display can provide a larger display area and excellent performance such as portability, and is becoming more and more popular with consumers.

SUMMARY

Embodiments of the present disclosure provide a display module, including:
- a display panel, including a first non-bending area, a bending area and a second non-bending area, wherein the first non-bending area is connected to the second non-bending area through the bending area, and the bending area is configured to bend or unfold the display module;
- a support planarization layer, wherein the support planarization layer is disposed on a side facing away from a display face of the display panel, and the support planarization layer is configured to support and planarize the display panel;
- a first heat dissipation layer, wherein the first heat dissipation layer is in the first non-bending area, and the first heat dissipation layer is disposed on a side of the support planarization layer facing away from the display panel; and
- a second heat dissipation layer, wherein the second heat dissipation layer is in the second non-bending area, and the second heat dissipation layer is disposed on the side of the support planarization layer facing away from the display panel;
- the first heat dissipation layer and the second heat dissipation layer are arranged on a same layer, both the first heat dissipation layer and the second heat dissipation layer are grounded, and at least one of the first heat dissipation layer or the second heat dissipation layer is electrically connected with the support planarization layer.

In some embodiments, at least one of the first heat dissipation layer or the second heat dissipation layer is electrically connected with the support planarization layer through a conductive fabric.

In some embodiments, the conductive fabric includes a first conductive fabric, one end of the first conductive fabric is electrically connected with the support planarization layer located in the bending area, and the other end of the first conductive fabric is in contact with a side face of the first heat dissipation layer facing the second heat dissipation layer and covers part of a surface of the first heat dissipation layer facing away from the support planarization layer; and/or
the conductive fabric includes a second conductive fabric, one end of the second conductive fabric is electrically connected with the support planarization layer located in the bending area, and the other end of the second conductive fabric is in contact with a side face of the second heat dissipation layer facing the first heat dissipation layer and covers part of a surface of the second heat dissipation layer facing away from the support planarization layer.

In some embodiments, the conductive fabric includes the first conductive fabric and the second conductive fabric, a part where the first conductive fabric is electrically connected with the support planarization layer and a part where the second conductive fabric is electrically connected with the support planarization layer are disconnected from each other.

In some embodiments, the display module further includes a first adhesive layer located in the first non-bending area and disposed between the support planarization layer and the first heat dissipation layer, and a second adhesive layer located in the second non-bending area and disposed between the support planarization layer and the second heat dissipation layer.
the first adhesive layer and the second adhesive layer are arranged on a same layer;
the first heat dissipation layer is electrically connected with the support planarization layer through a first via hole that penetrates through the first adhesive layer and the first heat dissipation layer, and/or, the second heat dissipation layer is electrically connected with the support planarization layer through a second via hole that penetrates through the second adhesive layer and the second heat dissipation layer.

In some embodiments, the first heat dissipation layer is electrically connected with the support planarization layer through a conductive adhesive filled in the first via hole, and/or, the second heat dissipation layer is electrically connected with the support planarization layer through a conductive adhesive filled in the second via hole.

In some embodiments, a quantity of the first via hole is a plurality, and/or, a quantity of the second via hole is a plurality.

In some embodiments, a material of the support planarization layer is a flexible metal material;
a material of the first heat dissipation layer is a rigid metal material; and
a material of the second heat dissipation layer is a rigid metal material.

In some embodiments, the display module further includes a touch control panel disposed on the display face of the display module;
the display panel is bonded to the touch control panel through a third adhesive layer, and the display panel is bonded to the support planarization layer through a fourth adhesive layer.

Correspondingly, embodiments of the present disclosure further provide a display apparatus, including the above display module provided by embodiments of the present disclosure.

DETAILED DESCRIPTION OF THE EMBODIMENTS

Figure 1:
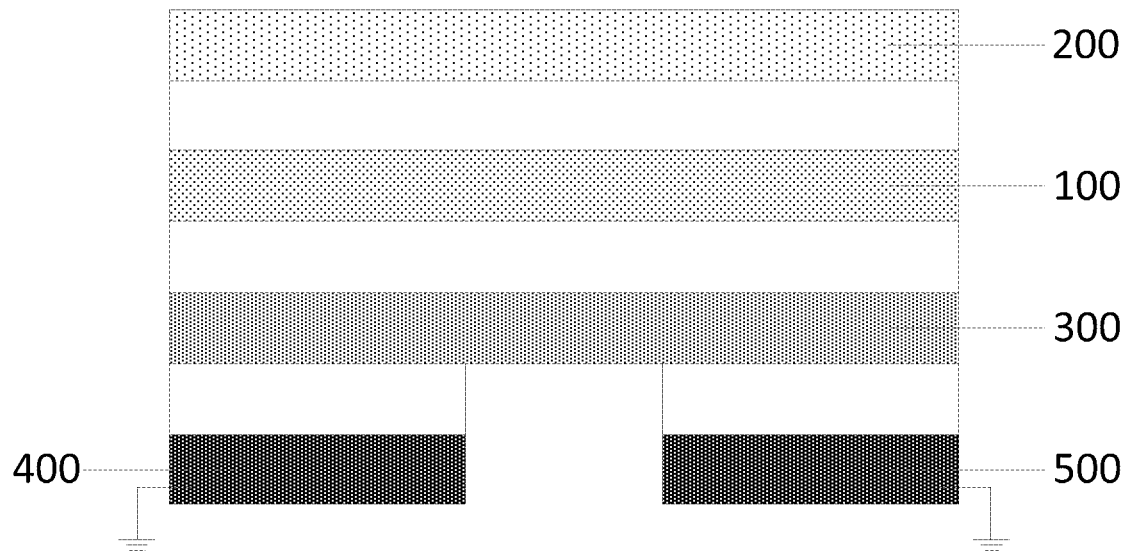
FIG. 1 is a schematic structural diagram of a display module, provided by an embodiment of the related art.

In order to make the objectives, technical solutions, and advantages of embodiments of the present disclosure clearer, the technical solutions of embodiments of the present disclosure will be described clearly and completely in conjunction with the accompanying drawings of embodiments of the present disclosure. Obviously, the described embodiments are part of embodiments of the present disclosure, rather than all of embodiments. Based on the described embodiments of the present disclosure, all other embodiments obtained by those of ordinary skill in the art without creative labor are within the protection scope of the present disclosure.

Unless otherwise defined, the technical terms or scientific terms used herein shall have the usual meanings understood by those of ordinary skill in the art to which the present disclosure belongs. "First", "second" and similar words used in the specification and claims of the present disclosure do not indicate any order, quantity or importance, but are only configured to distinguish different components. "Include" or "comprise" and other similar words mean that the element or item appearing before the word encompasses the element or item listed after the word and its equivalents, but does not exclude other elements or items. "Inner", "outer", "upper", "lower", etc. are only configured to indicate the relative positional relationship. When the absolute position of the described object changes, the relative positional relationship may also change accordingly.

It should be noted that size and shape of each figure in the drawings do not reflect the true ratio, and the purpose is only to illustrate the present disclosure. The same or similar reference numerals indicate the same or similar elements or elements with the same or similar functions.

A folding display module in the related art, as shown in FIG. 1, includes a display panel 100 and a touch control panel 200 arranged in a stacked mode. Because the panels are both bendable flexible panels, in order to meet the needs of a bent display panel, a full layer of support planarization layer 300 will be arranged on a non-display face of the display panel 100, and the support planarization layer 300 is flexible as well. In order to realize a folding function, heat dissipation layers of the display module are generally divided into two independent layers (a first heat dissipation layer 400 and a second heat dissipation layer 500), and the first heat dissipation layer 400 and the second heat dissipation layer 500 are grounded. However, because a material of the support planarization layer 300 is a metal material, and the support planarization layer 300 is not grounded, in a bending process of the display module, the support planarization layer 300 will interfere with touch control signals in the touch control panel and affect touch control performance.

Figure 2:
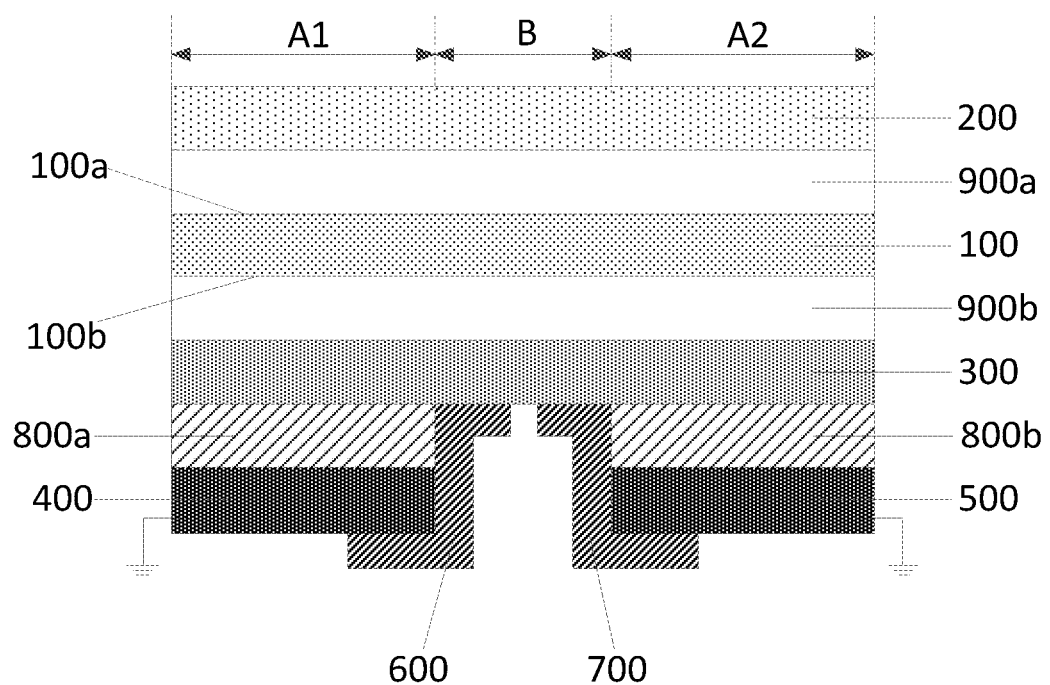
FIG. 2 is a schematic structural diagram of a display module, provided by an embodiment of the present disclosure.

In view of this, embodiments of the present disclosure provide a display module, as shown in FIGS. 2-4 and FIGS. 6-8, including:

a display panel 100, the display panel 100 is a flexible display panel, the display panel 100 includes a first non-bending area A1, a bending area B and a second non-bending area A2, the first non-bending area A1 is connected to the second non-bending area A2 through the bending area B, and the bending area B is configured to bend or unfold the display module; the bending area B refers to an area bent and stretched when the display module is bent, and the first non-bending area A1 and the second non-bending area A2 refer to areas which are not bent when the display module is bent; the bending area and the non-bending areas may be divided according to different models of display modules and different application scenarios, and specific division of the bending area and the non-bending areas in FIG. 2 of embodiment of the present disclosure is only one implementation, which is not limited herein; and further, a surface of the display panel 100 configured to display an image is called a display face 100a, and a face opposite to the display face 100a is called a non-display face 100b;

a support planarization layer 300, the support planarization layer 300 is disposed on a side facing away from the display face 100a of the display panel 100, and the support planarization layer 300 is configured to support and planarize the display panel 100. In some embodiments, the bendable flexible display panel is not enough in overall rigidity, the support planarization layer 300 may be configured to support the flexible display panel, the support planarization layer 300 provides rigid support for the flexible display panel in the first non-bending area A1 and the second non-bending area A2, a problem that the flexible display panel generates flexible deformation in a full bonding process is solved. Therefore, a problem that a surface of the flexible display panel after full bonding is uneven is solved, surface flatness of the flexible display panel is thereby improved, and, generally, a material of the support planarization layer 300 is metal;

a first heat dissipation layer 400, the first heat dissipation layer 400 is located in the first non-bending area A1, and the first heat dissipation layer 400 is disposed on a side of the support planarization layer 300 facing away from the display panel 100; and a second heat dissipation layer 500, the second heat dissipation layer 500 is located in the second non-bending area A2, and the second heat dissipation layer 500 is disposed on the side of the support planarization layer 300 facing away from the display panel 100.

The first heat dissipation layer 400 and the second heat dissipation layer 500 may radiate heat generated by the display panel 100 toward outside, and the first heat dissipation layer 400 and the second heat dissipation layer 500 may also be configured to conduct static electricity on the display module, so as to avoid an influence of static electricity on a display effect.

The first heat dissipation layer 400 and the second heat dissipation layer 500 are arranged on a same layer, and both the first heat dissipation layer 400 and the second heat dissipation layer 500 are grounded; and in some embodiments, a material of the first heat dissipation layer 400 and a material of the second heat dissipation layer 500 is metal, and metal affects display and touch control of the display module, so both the first heat dissipation layer 400 and the second heat dissipation layer 500 are grounded.

Figure 3:
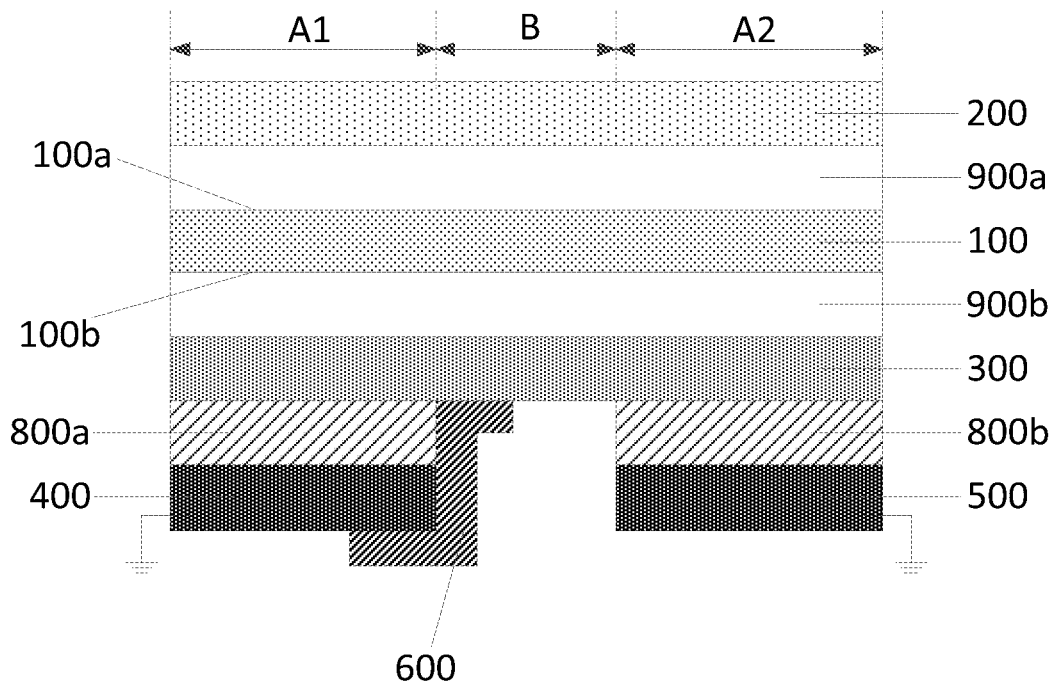
FIG. 3 is a schematic structural diagram of another display module, provided by an embodiment of the present disclosure.
Figure 6:
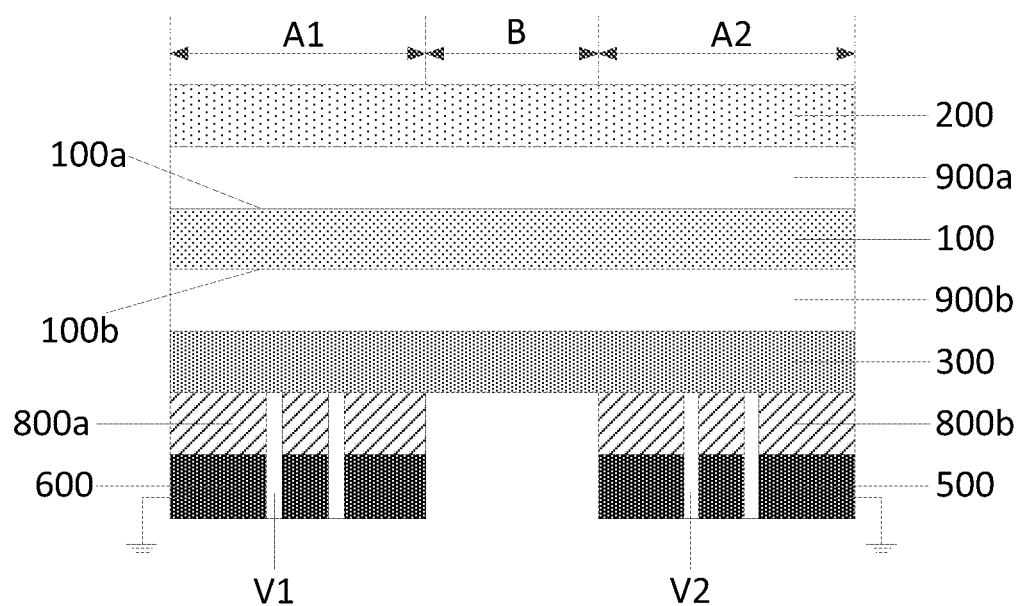
FIG. 6 is a schematic structural diagram of yet another display module, provided by an embodiment of the present disclosure.
Figure 7:
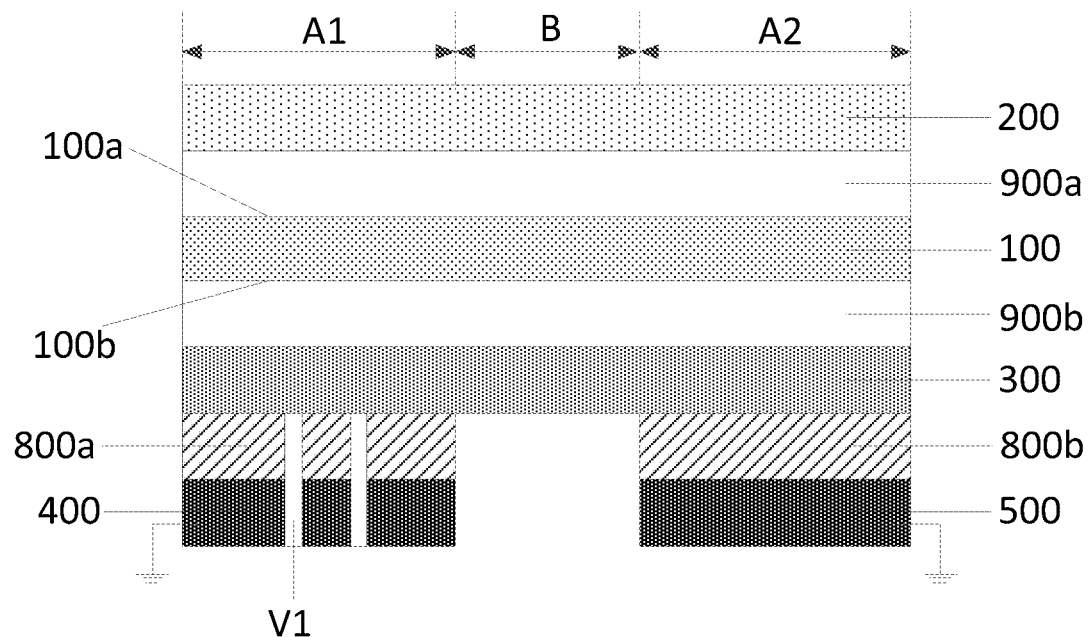
FIG. 7 is a schematic structural diagram of yet another display module, provided by an embodiment of the present disclosure.
Figure 8:
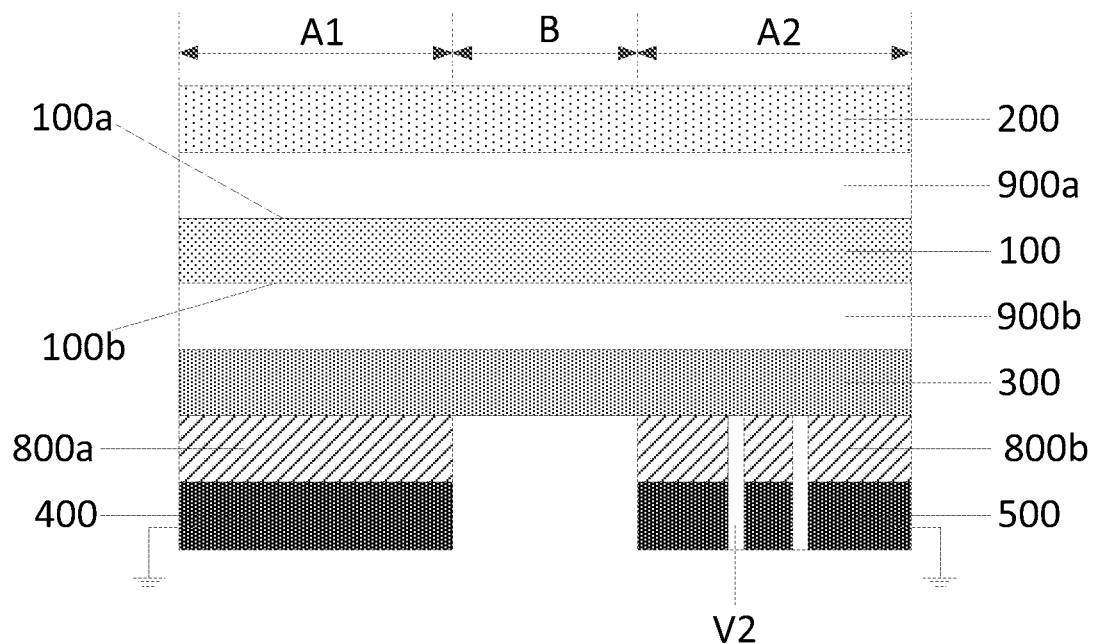
FIG. 8 is a schematic structural diagram of yet another display module, provided by an embodiment of the present disclosure.

At least one of the first heat dissipation layer 400 or the second heat dissipation layer 500 is electrically connected with the support planarization layer 300. As shown in FIGS. 3 and 7, the first heat dissipation layer 400 is electrically connected with the support planarization layer 300, or as shown in FIGS. 4 and 8, the second heat dissipation layer 500 is electrically connected with the support planarization layer 300; or as shown in FIGS. 2 and 6, the first heat dissipation layer 400 and the second heat dissipation layer 500 are both electrically connected with the support planarization layer 300, so grounding of the support planarization layer 300 is realized.

According to the above display module provided by embodiments of the present disclosure, through electrical connection between at least one of the first heat dissipation layer 400 or the second heat dissipation layer 500 and the support planarization layer 300, grounding of the support planarization layer 300 made of metal may be realized, so the grounded support planarization layer 300 will not affect touch control signals in the display module, thereby improving touch control performance of the display module.

Figure 4:
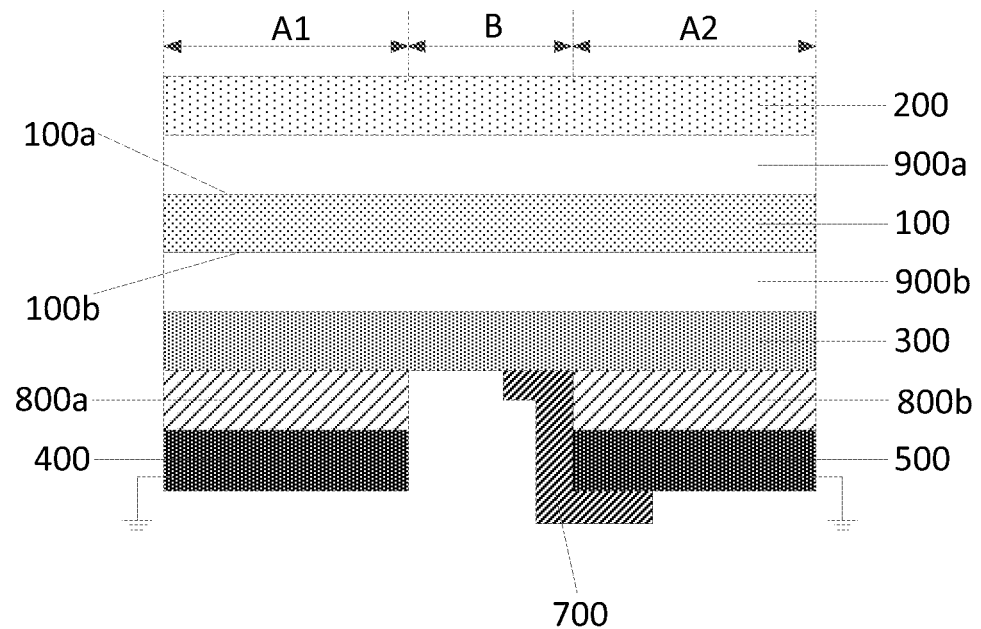
FIG. 4 is a schematic structural diagram of further another display module, provided by an embodiment of the present disclosure.

In some embodiments, as shown in FIGS. 2-4, at least one of the first heat dissipation layer 400 or the second heat dissipation layer 500 is electrically connected with the support planarization layer 300 through conductive fabrics (600, 700). In some embodiments, as shown in FIG. 2, the first heat dissipation layer 400 and the second heat dissipation layer 500 are electrically connected with the support planarization layer 300 through the corresponding conductive fabrics (600, 700); and as shown in FIG. 3, the first heat dissipation layer 400 is electrically connected with the support planarization layer 300 through the conductive fabric (600); as shown in FIG. 4, the second heat dissipation layer 500 is electrically connected with the support planarization layer 300 through the conductive fabric (700). Any one of embodiments in FIGS. 2-4 may realize grounding of the support planarization layer 300, so the support planarization layer 300 will not affect the touch control signals in the display module, thereby improving the touch control performance of the display module.

In some embodiments, as shown in FIGS. 2-4, the conductive fabric includes the first conductive fabric 600, and/or the second conductive fabric 700. In some embodiments, as shown in FIG. 2, the conductive fabric includes the first conductive fabric 600 and the second conductive fabric 700; as shown in FIG. 3, the conductive fabric includes the first conductive fabric 600; and as shown in FIG. 4, the conductive fabric includes the second conductive fabric 700.

As shown in FIGS. 2 and 3, one end of the first conductive fabric 600 is electrically connected with the support planarization layer 300 located in the bending area B, and the other end of the first conductive fabric 600 is in contact with a side of the first heat dissipation layer 400 facing the second heat dissipation layer 500 and covers part of a surface of the first heat dissipation layer 400 facing away from the support planarization layer 300.

As shown in FIGS. 2 and 4, one end of the second conductive fabric 700 is electrically connected with the support planarization layer 300 located in the bending area B, and the other end of the second conductive fabric 700 is in contact with a side of the second heat dissipation layer 500 facing the first heat dissipation layer 400 and covers part of a surface of the second heat dissipation layer 500 facing away from the support planarization layer 300.

In some embodiments, in order to ensure even grounding of the support planarization layer, and realize symmetrical evenness of film layers in the display module, the embodiment of the present disclosure preferably adopts an implementation of including the first conductive fabric 600 and the second conductive fabric 700 as shown in FIG. 2.

In some embodiments, as shown in FIG. 2, when the conductive fabric includes the first conductive fabric 600 and the second conductive fabric 700, in order to avoid influence on bending performance of the display module, a part where the first conductive fabric 600 is electrically connected with the support planarization layer 300 and a part where the second conductive fabric 700 is electrically connected with the support planarization layer 300 respectively are disconnected from each other. In this way, even grounding of the support planarization layer can be realized, symmetrical evenness of the film layers in the display module can be realized, and the bending performance of the display module will not be affected.

Figure 5:
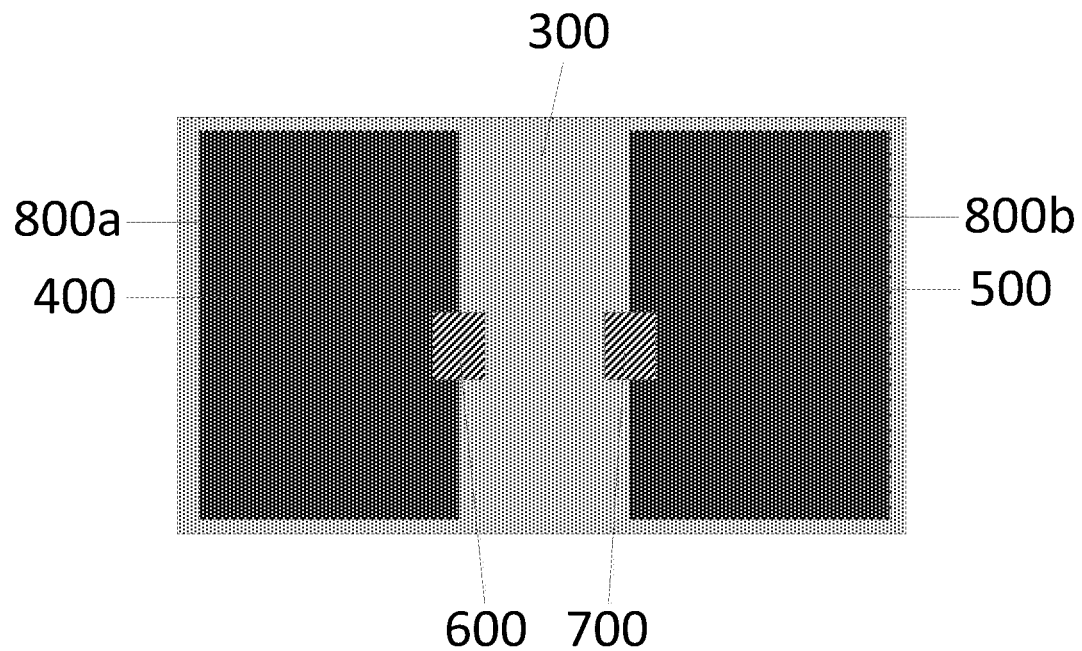
FIG. 5 is a top-viewed schematic structural diagram of part of film layers of the display module shown in FIG. 2.

In some embodiments, taking the conductive fabric including the first conductive fabric 600 and the second conductive fabric 700 as shown in FIG. 2 as an example, as shown in FIG. 5, FIG. 5 is a top-viewed schematic structural diagram of part of the film layers of the display module shown in FIG. 2, and FIG. 5 illustrates a top-viewed schematic structural diagram of the support planarization layer 300, a first adhesive layer 800*a*, a second adhesive layer 800*b*, the first heat dissipation layer 400, the second heat dissipation layer 500, the first conductive fabric 600, and the second conductive fabric 700. The first conductive fabric 600 only needs to cover part of the first heat dissipation layer 400, and the second conductive fabric 700 only needs to cover part of the second heat dissipation layer 500, i.e. a size of the first conductive fabric 600 only needs to realize electrical connection between the first heat dissipation layer 400 and the support planarization layer 300 and the second conductive fabric 700 only needs to realize electrical connection between the second heat dissipation layer 500 and the support planarization layer 300, so use of the conductive fabric may be saved. The sizes of the first conductive fabric 600 and the second conductive fabric 700 may also be designed according to actual needs, which are not limited by the present disclosure.

In some embodiments, as shown in FIGS. 6-8, the display module further includes: the first adhesive layer 800*a* located in the first non-bending area A1 and disposed between the support planarization layer 300 and the first heat dissipation layer 400, and the second adhesive layer 800*b* located in the second non-bending area A2 and disposed between the support planarization layer 300 and the second heat dissipation layer 500. The first adhesive layer 800*a* and the second adhesive layer 800*b* are arranged on a same layer.

The first heat dissipation layer 400 is electrically connected with the support planarization layer 300 through a first via hole V1 that penetrates through the first adhesive layer 800*a* and the first heat dissipation layer 400, and/or, the second heat dissipation layer 500 is electrically connected with the support planarization layer 300 through a second via hole V2 that penetrates through the second adhesive layer 800b and the second heat dissipation layer 500.

In some embodiments, as shown in FIG. 6, the first heat dissipation layer 400 is electrically connected with the support planarization layer 300 through the first via hole V1 that penetrates through the first adhesive layer 800a and the first heat dissipation layer 400, and the second heat dissipation layer 500 is electrically connected with the support planarization layer 300 through the second via hole V2 that penetrates through the second adhesive layer 800b and the second heat dissipation layer 500; as shown in FIG. 7, the first heat dissipation layer 400 is electrically connected with the support planarization layer 300 through the first via hole V1 that penetrates through the first adhesive layer 800a and the first heat dissipation layer 400; and as shown in FIG. 8, the second heat dissipation layer 500 is electrically connected with the support planarization layer 300 through the second via hole V2 that penetrates through the second adhesive layer 800b and the second heat dissipation layer 500.

In some embodiments, as shown in FIGS. 6-8, the first heat dissipation layer 400 is electrically connected with the support planarization layer 300 through a conductive adhesive (not shown in the figure) filled in the first via hole V1, and/or, the second heat dissipation layer 500 is electrically connected with the support planarization layer 300 through a conductive adhesive (not shown in the figure) filled in the second via hole V2. In some embodiments, as shown in FIG. 6, the first heat dissipation layer 400 is electrically connected with the support planarization layer 300 through the conductive adhesive (not shown in the figure) filled in the first via hole V1, and the second heat dissipation layer 500 is electrically connected with the support planarization layer 300 through the conductive adhesive (not shown in the figure) filled in the second via hole V2; as shown in FIG. 7, the first heat dissipation layer 400 is electrically connected with the support planarization layer 300 through the conductive adhesive (not shown in the figure) filled in the first via hole V1; and as shown in FIG. 8, the second heat dissipation layer 500 is electrically connected with the support planarization layer 300 through the conductive adhesive (not shown in the figure) filled in the second via hole V2.

Figure 9:
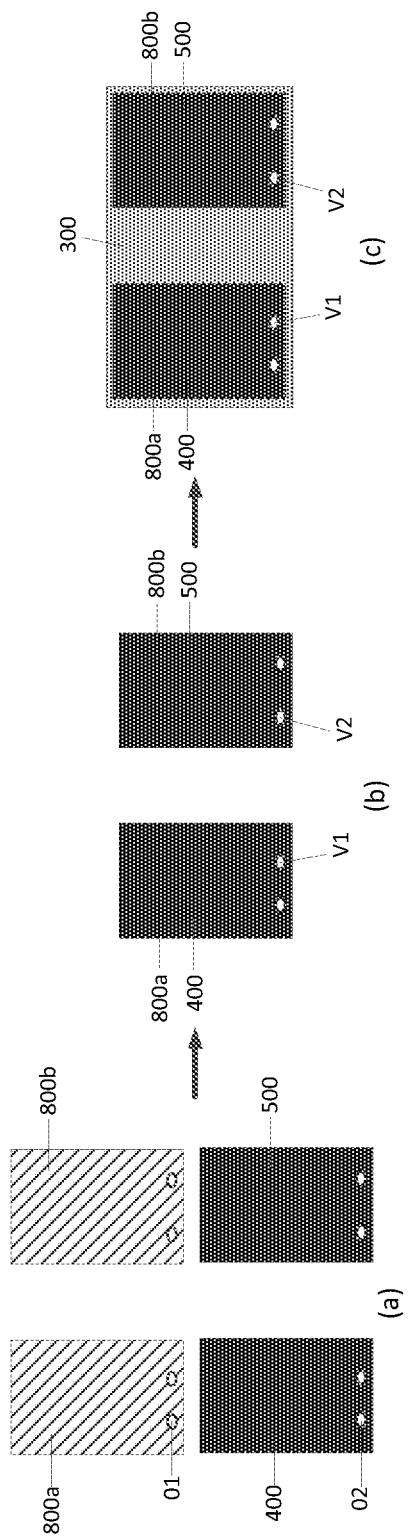
FIG. 9 is a schematic diagram of a bonding flow of part of film layers of the display module shown in FIG. 6

In some embodiments, taking a structure shown in FIG. 6 as an example: as shown by (a) in FIG. 9, a via hole 01 is first formed in the first adhesive layer 800a through a die cutting mode, and then a via hole 02 is formed in the first heat dissipation layer 400 at a position corresponding to the via hole 01 in the first adhesive layer 800a; as shown by (b) in FIG. 9, then the via hole 01 in the first adhesive layer 800a is bonded with the via hole 02 in the first heat dissipation layer 400 in an alignment mode, so that the first via hole V1 is formed in the first adhesive layer 800a and the first heat dissipation layer 400; and as shown by (c) in FIG. 9, a side of the first adhesive layer 800a facing away from the first heat dissipation layer 400 is bonded with the support planarization layer 300, and then the conductive adhesive is filled in the first via hole V1 in a dispersing mode, so electrical connection between the first heat dissipation layer 400 and the support planarization layer 300 is realized. Similarly, as shown by (a)-(c) in FIG. 9, electrical connection between the second heat dissipation layer 500 and the support planarization layer 300 is realized in the same way.

In some embodiments, in order to ensure earth potential evenness of the support planarization layer, in the above display module provided by the embodiment of the present disclosure, as shown in FIGS. 6-8, the quantity of the first via hole V1 may be a plurality, and/or, the quantity of the second via hole V2 may be a plurality.

It should be noted that, embodiments of the present disclosure are described by taking the quantity of the first via holes and the quantity of the second via holes each being 2 as an example. Of course, those of skill in the art should know that the quantity of the first via holes and the quantity of the second via holes are not limited thereto, and embodiments of the present disclosure do not limit this.

In some embodiments, shapes of the first via holes and the second via holes may be arranged according to needs. For example, the first via holes and the second via holes may be regularly formed in a rectangular, circular, elliptical, rhombic shape, and of course, the first via holes and the second via holes may also be in irregular shapes. As shown in FIG. 9, the first via holes V1 and the second via holes V2 in embodiments of the present disclosure are illustrated in an elliptical shape.

In some embodiments, a material of the support planarization layer is generally a flexible metal material, such as a steel plate; and a material of the first heat dissipation layer and the second heat dissipation layer is generally a rigid metal material, such as copper foil with relatively good electricity conducting and heat conducting performance.

In some embodiments, as shown in FIGS. 2-4 and FIGS. 6-8, the display module may further include a touch control panel 200 disposed on the display face 100a of the display module 100. The display panel 100 is bonded to the touch control panel 200 through a third adhesive layer 900a, and the display panel 100 is bonded to the support planarization layer 300 through a fourth adhesive layer 900b.

In some embodiments, as shown in FIGS. 2-4, the display module may further include: the first adhesive layer 800a located in the first non-bending area A1 and disposed between the support planarization layer 300 and the first heat dissipation layer 400, and the second adhesive layer 800b located in the second non-bending area A2 and disposed between the support planarization layer 300 and the second heat dissipation layer 500. The first adhesive layer 800a and the second adhesive layer 800b are arranged on a same layer.

In some embodiments, the first adhesive layer, the second adhesive layer, the third adhesive layer and the fourth adhesive layer may all be optical clear adhesive (OCA).

Base on the same inventive concept, embodiments of the present disclosure further provide a display apparatus, including the above organic light emitting display module provided by embodiments of the present disclosure. The display apparatus may be any product or component with a display function, such as a mobile phone, a tablet computer, a television, a monitor, a notebook computer, a digital photo frame, a navigator, and the like. The problem-solving principle of the display apparatus is similar to that of the aforementioned display module. Therefore, implementation of the display apparatus may refer to implementation of the aforementioned display module, and repetition is not repeated here.

In some embodiments, the display apparatus provided by the embodiment of the present disclosure may be an organic light-emitting diode (OLED) display apparatus or other types of display components.

According to the display module and the display apparatus provided by embodiments of the present disclosure, the display module may realize grounding of the support planarization layer through electrical connection with at least one of the first heat dissipation layer or the second heat dissipation layer and the support planarization layer, so the grounded support planarization layer will not affect the touch control signals in the display module, thereby improving touch control performance of the display module.

Obviously, embodiments described in the drawings are only part of embodiments of the present disclosure, rather than all embodiments. Those of skill in the art can make various changes and modifications to the present disclosure without departing from the spirit and scope of the present disclosure. In this way, if these variations and modifications of the present disclosure fall within the scope of the claims of the present disclosure and equivalent technologies, the present disclosure also intends to include these modifications and variations.

What is claimed is:

1. A display module, comprising:
   a display panel, comprising a first non-bending area, a bending area and a second non-bending area, wherein the first non-bending area is connected to the second non-bending area through the bending area, and the bending area is configured to bend or unfold the display module;
   a support planarization layer, wherein the support planarization layer is disposed on a side facing away from a display face of the display panel, and the support planarization layer is configured to support and planarize the display panel;
   a first heat dissipation layer, wherein the first heat dissipation layer is in the first non-bending area, and the first heat dissipation layer is disposed on a side of the support planarization layer facing away from the display panel; and
   a second heat dissipation layer, wherein the second heat dissipation layer is in the second non-bending area, and the second heat dissipation layer is disposed on the side of the support planarization layer facing away from the display panel;
   wherein the first heat dissipation layer and the second heat dissipation layer are arranged on a same layer, both the first heat dissipation layer and the second heat dissipation layer are grounded, and at least one of the first heat dissipation layer or the second heat dissipation layer is electrically connected with the support planarization layer; and
   at least one of the first heat dissipation layer or the second heat dissipation layer is electrically connected with the support planarization layer through a conductive fabric.

2. The display module according to claim 1, wherein the conductive fabric comprises a first conductive fabric, one end of the first conductive fabric is electrically connected with the support planarization layer located in the bending area, and the other end of the first conductive fabric is in contact with a side face of the first heat dissipation layer facing the second heat dissipation layer and covers part of a surface of the first heat dissipation layer facing away from the support planarization layer; and
   the conductive fabric comprises a second conductive fabric, one end of the second conductive fabric is electrically connected with the support planarization layer in the bending area, and the other end of the second conductive fabric is in contact with a side face of the second heat dissipation layer facing the first heat dissipation layer and covers part of a surface of the second heat dissipation layer facing away from the support planarization layer.

3. The display module according to claim 2, wherein a part of the first conductive fabric electrically connected with the support planarization layer and a part of the second conductive fabric electrically connected with the support planarization layer are disconnected from each other.

4. The display module according to claim 1, further comprising:
   a first adhesive layer located in the first non-bending area and disposed between the support planarization layer and the first heat dissipation layer; and
   a second adhesive layer located in the second non-bending area and disposed between the support planarization layer and the second heat dissipation layer;
   wherein the first adhesive layer and the second adhesive layer are arranged on a same layer; and
   the first heat dissipation layer is electrically connected with the support planarization layer through a first via hole that penetrates through the first adhesive layer and the first heat dissipation layer, and, the second heat dissipation layer is electrically connected with the support planarization layer through a second via hole that penetrates through the second adhesive layer and the second heat dissipation layer.

5. The display module according to claim 4, wherein:
   the first heat dissipation layer is electrically connected with the support planarization layer through a conductive adhesive filled in the first via hole; and
   the second heat dissipation layer is electrically connected with the support planarization layer through a conductive adhesive filled in the second via hole.

6. The display module according to claim 5, wherein a quantity of the first via hole is a plurality, and/or, a quantity of the second via hole is a plurality.

7. The display module according to claim 1, wherein a material of the support planarization layer is a flexible metal material;
   a material of the first heat dissipation layer is a rigid metal material; and
   a material of the second heat dissipation layer is a rigid metal material.

8. The display module according to claim 1, further comprising:
   a touch control panel disposed on the display face of the display module;
   wherein the display panel is bonded to the touch control panel through a third adhesive layer; and
   the display panel is bonded to the support planarization layer through a fourth adhesive layer.

9. A display apparatus, comprising the display module according to claim 1.

10. The display module according to claim 1, wherein the conductive fabric comprises a first conductive fabric, one end of the first conductive fabric is electrically connected with the support planarization layer located in the bending area, and the other end of the first conductive fabric is in contact with a side face of the first heat dissipation layer facing the second heat dissipation layer and covers part of a surface of the first heat dissipation layer facing away from the support planarization layer.

11. The display module according to claim 1, wherein the conductive fabric comprises a second conductive fabric, one end of the second conductive fabric is electrically connected with the support planarization layer in the bending area, and the other end of the second conductive fabric is in contact with a side face of the second heat dissipation layer facing the first heat dissipation layer and covers part of a surface of the second heat dissipation layer facing away from the support planarization layer.

12. The display module according to claim 1, further comprising:
 a first adhesive layer located in the first non-bending area and disposed between the support planarization layer and the first heat dissipation layer; and
 a second adhesive layer located in the second non-bending area and disposed between the support planarization layer and the second heat dissipation layer;
 wherein the first adhesive layer and the second adhesive layer are arranged on a same layer; and
 the first heat dissipation layer is electrically connected with the support planarization layer through a first via hole that penetrates through the first adhesive layer and the first heat dissipation layer.

13. The display module according to claim 12, wherein the first heat dissipation layer is electrically connected with the support planarization layer through a conductive adhesive filled in the first via hole.

14. The display module according to claim 1, further comprising:
 a first adhesive layer located in the first non-bending area and disposed between the support planarization layer and the first heat dissipation layer; and
 a second adhesive layer located in the second non-bending area and disposed between the support planarization layer and the second heat dissipation layer;
 wherein the first adhesive layer and the second adhesive layer are arranged on a same layer; and
 the second heat dissipation layer is electrically connected with the support planarization layer through a second via hole that penetrates through the second adhesive layer and the second heat dissipation layer.

15. The display module according to claim 14, wherein the second heat dissipation layer is electrically connected with the support planarization layer through a conductive adhesive filled in the second via hole.

16. The display apparatus according to claim 9, wherein the conductive fabric comprises a first conductive fabric, one end of the first conductive fabric is electrically connected with the support planarization layer located in the bending area, and the other end of the first conductive fabric is in contact with a side face of the first heat dissipation layer facing the second heat dissipation layer and covers part of a surface of the first heat dissipation layer facing away from the support planarization layer; and
 the conductive fabric comprises a second conductive fabric, one end of the second conductive fabric is electrically connected with the support planarization layer in the bending area, and the other end of the second conductive fabric is in contact with a side face of the second heat dissipation layer facing the first heat dissipation layer and covers part of a surface of the second heat dissipation layer facing away from the support planarization layer.

17. The display apparatus according to claim 16, wherein a part of the first conductive fabric electrically connected with the support planarization layer and a part of the second conductive fabric electrically connected with the support planarization layer are disconnected from each other.

18. The display module according to claim 9, further comprising:
 a first adhesive layer located in the first non-bending area and disposed between the support planarization layer and the first heat dissipation layer; and
 a second adhesive layer located in the second non-bending area and disposed between the support planarization layer and the second heat dissipation layer;
 wherein the first adhesive layer and the second adhesive layer are arranged on a same layer; and
 the first heat dissipation layer is electrically connected with the support planarization layer through a first via hole that penetrates through the first adhesive layer and the first heat dissipation layer, and, the second heat dissipation layer is electrically connected with the support planarization layer through a second via hole that penetrates through the second adhesive layer and the second heat dissipation layer.

\* \* \* \* \*